(12) United States Patent
Lee

(10) Patent No.: US 7,605,070 B2
(45) Date of Patent: Oct. 20, 2009

(54) SEMICONDUCTOR DEVICE HAVING CONTACT PLUG FORMED IN DOUBLE STRUCTURE BY USING EPITAXIAL STACK AND METAL LAYER AND METHOD FOR FABRICATING THE SAME

(75) Inventor: Young-Ho Lee, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 554 days.

(21) Appl. No.: 11/154,474

(22) Filed: Jun. 17, 2005

(65) Prior Publication Data

US 2006/0240655 A1    Oct. 26, 2006

(30) Foreign Application Priority Data

Apr. 21, 2005    (KR) .................. 10-2005-0033263

(51) Int. Cl.
    *H01L 21/20*    (2006.01)
(52) U.S. Cl. ............... 438/607; 438/675; 257/E21.092; 257/E21.586
(58) Field of Classification Search .......... 438/607, 438/674, 675; 257/748, E21.091, E21.092, 257/E21.586
See application file for complete search history.

(56) References Cited

U.S. PATENT DOCUMENTS

| 6,030,894 | A  | * | 2/2000 | Hada et al. ................ 438/675 |
| 6,333,216 | B1 | * | 12/2001 | Norstrom .................. 438/197 |
| 6,391,796 | B1 | * | 5/2002 | Akiyama et al. ........... 438/763 |
| 6,521,508 | B1 | * | 2/2003 | Cheong et al. ............. 438/416 |
| 2004/0180547 | A1 | * | 9/2004 | Beintner .................... 438/694 |

* cited by examiner

*Primary Examiner*—Minh-Loan T Tran
*Assistant Examiner*—W. Wendy Kuo
(74) *Attorney, Agent, or Firm*—Finnegan, Henderson, Farabow, Garrett & Dunner, L.L.P.

(57) ABSTRACT

Disclosed are a contact plug of a semiconductor device and a method for fabricating the same. The semiconductor device includes: an epitaxial stack formed by inserting a heteroepitaxy layer between a pair of homoepitaxy layers; and a contact plug including a metal layer on the epitaxial stack. Accordingly, in accordance with the present invention, the contact plug is selectively doped in a high concentration, thereby reducing a contact resistance. Furthermore, the present invention also provides an effect of reducing degradation in a device property without decreasing yields of products by minimizing a thermal budget through using a SEG-silicon germanium layer capable of obtaining a high doping concentration and a high deposition speed.

12 Claims, 6 Drawing Sheets

SEMICONDUCTOR DEVICE HAVING CONTACT PLUG FORMED IN DOUBLE STRUCTURE BY USING EPITAXIAL STACK AND METAL LAYER AND METHOD FOR FABRICATING THE SAME

FIELD OF THE INVENTION

The present invention relates to a method for fabricating a semiconductor device; and more particularly, to a contact plug of a semiconductor device and a method for fabricating the same.

DESCRIPTION OF RELATED ARTS

As a scale of integration has been increased and a size of a semiconductor device has been decreased, a dynamic random access memory (DRAM) has been influenced by a gradual reduction of a contact size within a cell transistor. That is, as a micronization and a high integration of the semiconductor device have been generated, there have been an increase in a contact resistance and a decrease in an operation current due to a decrease in a contact area caused by a decrease in the contact size. Accordingly, device degradation phenomena such as a tWR defect and degradation in a refresh property of the semiconductor device have been generated.

Thus, in order to reduce the contact resistance and improve the operation current, a typical method to increase a doping concentration in a junction portion of a silicon substrate or increase a concentration of phosphorus (P) doped within polysilicon used as the contact plug is used.

However, the above described method to increase the concentration brings a problem in degrading a breakdown voltage due to a diffusion of a dopant and decreasing a refresh property of a device.

Furthermore, polysilicon generally used as a contact material is deposited in a batch type furnace at a temperature ranging from approximately 500° C. to approximately 600° C. and in a doping concentration of P ranging from approximately $0.1 \times 10^{20}$ atoms/cm$^3$ to approximately $3.0 \times 10^{20}$ atoms/cm$^3$ along with supplying silane (SiH$_4$) and phosphine (PH$_3$) gases. Thus, during depositing the polysilicon, a fine oxide layer is formed in an interface between the polysilicon and the silicon substrate due to a concentration of oxygen (O$_2$), i.e., a concentration of O$_2$ of approximately several tens ppm, existing when the polysilicon is loaded to the furnace under an atmospheric pressure. The fine oxide layer provides a factor increasing the contact resistance of the device, and a resistance of the polysilicon itself is very high.

Recently, to overcome the above problems, a selective epitaxy growth (SEG) process and a solid phase epitaxy (SPE) process are suggested. Through the aforementioned two processes, an epitaxial silicon layer is formed in a single type chemical vapor deposition (CVD) apparatus and thus, the epitaxial silicon layer can be deposited at a low temperature even though a conventional process for fabricating a semiconductor device is used as it is. Also, the SEG process and the SPE process can overcome a conventional problem of polysilicon with a low doping concentration. Particularly, there has been an effort to apply selective epitaxial silicon or silicon germanium as a pad plug material to directly use metal as a contact plug.

FIG. 1 is a cross-sectional view illustrating a contact plug structure of a conventional semiconductor device.

Referring to FIG. 1, a plurality of gate patterns formed by sequentially stacking a gate oxide layer 12, a gate electrode 13 and a gate hard mask 14 are formed on a predetermined surface of a substrate 11. A plurality of spacers 15 are formed both sidewalls of the gate patterns. A source/drain junction 16 is formed on the substrate 11 between the gate patterns.

A SEG-silicon layer 17 is formed on a surface of the source/drain junction 16 as a contact plug through a SEG process.

However, in accordance with the conventional contact plug structure, since a natural oxide layer to be deposited on the surface of the substrate 11 should be completely removed to deposit the SEG-silicon layer 17, a plasma treatment process or an in-situ hydrogen bake treatment process is employed. At this time, a surface defect caused by a plasma and a thermal budget caused by the in-situ hydrogen bake treatment process are on-going problems.

Furthermore, it is possible to dope an amount ranging from approximately $1 \times 10^{20}$ atoms/cm$^3$ to approximately $1 \times 10^{21}$ atoms/cm$^3$ through a conventional method for depositing polysilicon or the conventional SPE process. However, only a doping concentration ranging from approximately $5 \times 10^{18}$ atoms/cm$^3$ to approximately $5 \times 10^{19}$ atoms/cm$^3$ is obtained through a method for depositing the SEG-silicon layer 17. Accordingly, the doping concentration obtained through the method for depositing the SEG-silicon layer 17 cannot be increased as much as that obtained through the conventional methods for depositing polysilicon or the SPE process, thereby providing a factor of increasing the resistance. To improve the above described problem, there has been another effort to increase a concentration through an additional ion-implantation method. However, in case of additionally implanting ions, an annealing process is required to settle a defect caused by implanting the ions and activate dopant implanted and thus, the thermal budget is additionally generated.

Furthermore, based on a property of the SEG process, a deposition speed is very low at a low deposition temperature and thus, it is compelled to raise the deposition temperature to obtain the productive deposition speed. Accordingly, the thermal budget caused by the raised deposition temperature is increased and thus, a device property becomes degraded due to a dopant diffusion. In case of decreasing the deposition temperature to reduce the thermal budget, the deposition speed is also dropped, thereby falling productivity. Hence, it is difficult to apply the SEG process to the semiconductor device with a size equal to or less than 100 nm.

Meanwhile, SEG-silicon germanium can be used as a simple alternative material at a fabrication method almost similar with the method for depositing the SEG-silicon layer.

Accordingly, for a next-generation semiconductor device with a size equal to or less than sub 100 nm, it is necessary to develop a method capable of obtaining a high deposition speed as providing a generally low thermal budget and increasing a doping concentration.

SUMMARY OF THE INVENTION

It is, therefore, an object of the present invention to provide a semiconductor device having a contact plug capable of preventing a defect and a thermal budget from being caused during processing a surface, a low doping concentration, a high thermal budget from being caused during depositing, and low yields of products, and a method for fabricating the same.

In accordance with one aspect of the present invention there is provided a semiconductor device, including: an epitaxial stack formed by inserting a heteroepitaxy layer between a pair of homoepitaxy layers; and a contact plug including a metal layer on the epitaxial stack.

In accordance with another aspect of the present invention, there is provided a method for fabricating a semiconductor device, including the steps of: forming an inter-layer insulation layer on a substrate; forming a contact hole opening a predetermined surface of the substrate by selectively etching the inter-layer insulation layer; performing a first pre-cleaning process to recover a defect on a bottom portion of the contact hole and remove a natural oxide layer; forming a sacrificial layer at a temperature forming an amorphous to remove a fine oxide layer remaining on a surface of the substrate of the bottom portion of the contact hole after performing the first pre-cleaning process; removing the sacrificial layer; forming an epitaxial stack including at least a SEG-silicon germanium layer through the SEG process on the contact hole; performing a second pre-cleaning process to remove the natural oxide layer on a surface of the epitaxial stack; and forming a metal layer filling the contact hole on the epitaxial stack.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on a preferred embodiment of the present invention will be provided with reference to the accompanying drawings.

Figure 1:
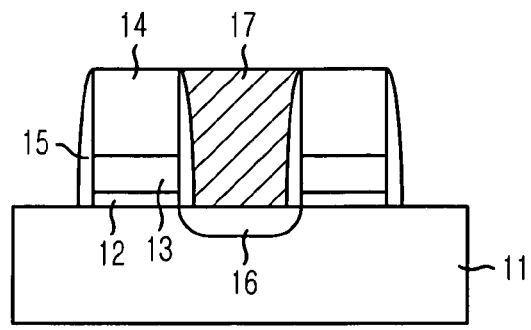
FIG. 1 is a cross-sectional view illustrating a contact plug structure of a conventional semiconductor device.
Figure 2:
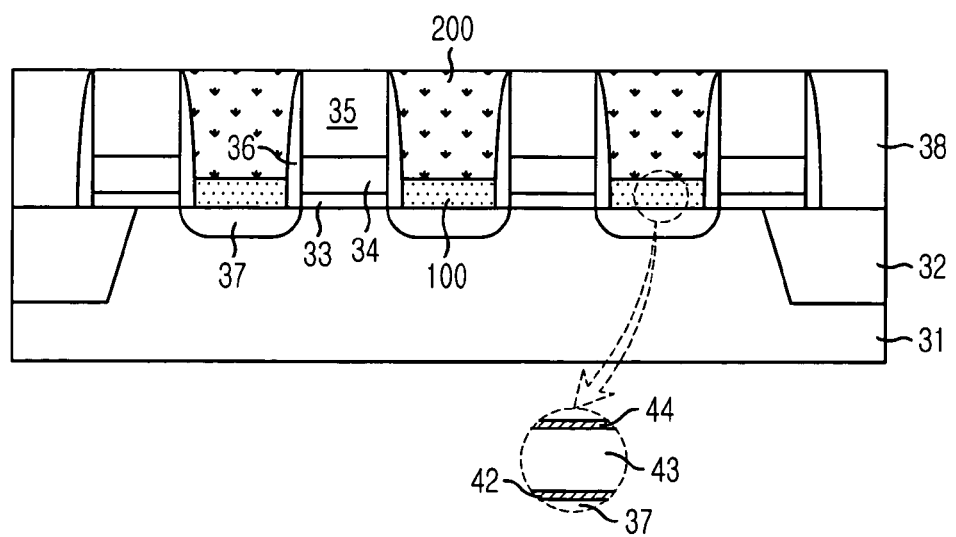
FIG. 2 is a cross-sectional view illustrating a contact plug structure of a semiconductor device in accordance with the present invention.

FIG. 2 is a cross-sectional view illustrating a contact plug structure of a semiconductor device in accordance with the present invention.

As shown in FIG. 2, a semiconductor device structure includes a substrate 31, a plurality of gate patterns formed on the substrate 31, a plurality of source/drain junctions 37 formed within the substrate 31 exposed between the plurality of gate patterns, a plurality of epitaxial stacks 100 on surfaces of the source/drain junctions 37 and a plurality of metal layers 200 on the epitaxial stacks 100 is shown.

The epitaxial stack 100 forming the contact plug is formed by sequentially stacking a first selective epitaxy growth (SEG)-silicon layer 42, a SEG-silicon germanium layer 43, and a second SEG-silicon layer 44 through a SEG process. The metal layer 200 is formed by one selected from a group consisting of titanium (Ti), titanium nitride (TiN), nickel (Ni), tungsten (W) and cobalt (Co). Herein, the first SEG-silicon layer 42, the SEG-silicon germanium layer 43 and the second SEG-silicon layer 44 are doped with phosphorous (P). A doping concentration of P ranges from approximately $1 \times 10^{19}$ atoms/cm$^3$ to approximately $5 \times 10^{19}$ atoms/cm$^3$ for the first SEG-silicon layer 42 and the second SEG-silicon layer 44 and a doping concentration of P ranges from approximately $8 \times 10^{19}$ atoms/cm$^3$ to approximately $1 \times 10^{20}$ atoms/cm$^3$ for the SEG-silicon germanium layer 43. Accordingly, the doping concentration of P for the SEG-silicon germanium layer 43 is relatively bigger than that for the first and the second SEG-silicon layers 42 and 44.

More specific to the epitaxial stack 100, the first SEG-silicon layer 42 serves roles in not only solving lattice disconformity between the SEG-silicon germanium layer 43 and the substrate 31, more preferably between the SEG-silicon germanium layer 43 and the source/drain junction 37 but also controlling a breakdown voltage by changing a general doping concentration of the epitaxial stack 100 used as the contact plug. The first SEG-silicon layer 42 is thinly deposited in a thickness ranging from approximately 10 Å to approximately 50 Å.

The SEG-silicon germanium layer 43 uses an epitaxial silicon germanium thin layer and a deposition property to solve a low doping concentration and a low deposition speed which are problems a SEG-silicon layer provides. The SEG-silicon germanium layer 43 is continuously grown in a predetermined thickness. At this time, the SEG-silicon germanium layer 43 is grown by adding germanium (Ge) with a content ratio ranging from approximately 5% to approximately 30% through implanting a Ge source gas. A thickness of the SEG-silicon germanium layer 43 ranges from approximately 100 Å to approximately 300 Å and thus, the SEG-silicon germanium layer 43 has a relatively bigger thickness than that of the first SEG-silicon layer 42.

Lastly, the second SEG-silicon layer 44 is used as a pad layer during forming the subsequent metal layer 200 and thus, makes it possible to apply the metal layer 200 as a contact plug. Herein, the second SEG-silicon layer 44 is deposited thinly in a thickness ranging form approximately 10 Å to approximately 50 Å as the first SEG-silicon layer 42 is thinly deposited in the identical thickness.

As shown in FIG. 2, a device isolation layer 32 is formed in a predetermined region of the substrate 31 and the gate patterns are formed by sequentially stacking a gate oxide layer 33, a gate electrode 34 and a gate hard mask 35. Also, a plurality of gate spacers 36 are formed in both sidewalls of the gate patterns.

As shown in FIG. 2, although explained later, the plurality of epitaxial stacks 100 are formed through the SEG process in predetermined portions of contact holes completed with a series of processes employed through forming and etching a sacrificial silicon layer. By performing the processes of forming the sacrificial silicon layer at a low temperature, and removing the sacrificial silicon layer by using an etching process, it is not necessary to employ a plasma treatment process or an in-situ hydrogen bake treatment process to remove the fine oxide layer, thereby minimizing a thermal budget.

As a result, the contact plug as shown in FIG. 2 is formed in a stack structure of the epitaxial stacks 100 and the metal layers 200, and the epitaxial stacks 100 are formed by sequentially stacking the first SEG-silicon layer 42, the SEG-silicon germanium layer 43 and the second SEG-silicon layer 44. That is, each of the epitaxial stacks 100 has a structure that a heteroepitaxy layer, e.g., the SEG-silicon germanium layer 43 is inserted between a pair of homoepitaxy layers, e.g., the first SEG-silicon layer 42 and the second SEG-silicon layer 44.

Accordingly, the SEG-silicon germanium layer 43 doped with highly concentrated P is included in accordance with the present invention and thus, a doping concentration of the contact plug can be increased. Furthermore, since a deposition speed of the SEG-silicon germanium layer 43 is faster than that of the SEG-silicon, thereby reducing the thermal budget.

FIGS. 3A to 3E are cross-sectional views illustrating a method for fabricating a contact plug of a semiconductor device in accordance with the present invention.

Figure 3A:
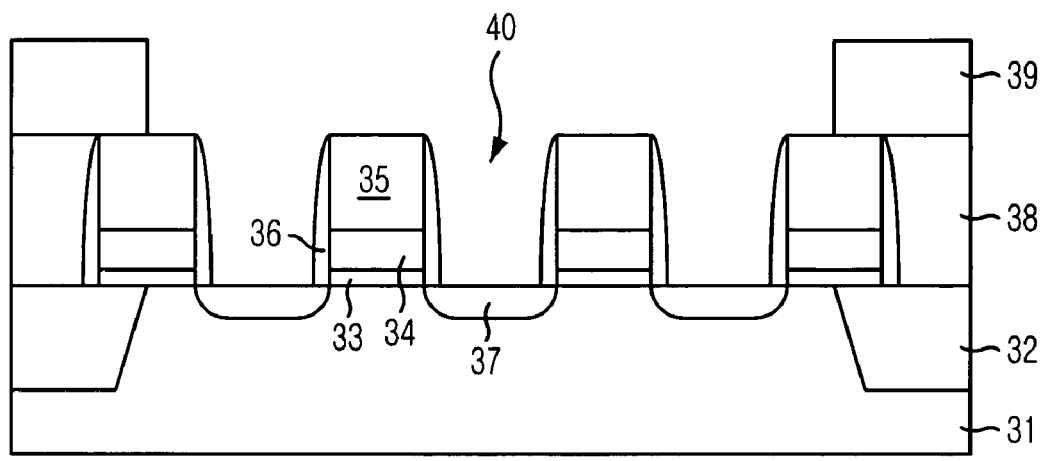
FIGS. 3A to 3E are cross-sectional views illustrating a method for fabricating a contact plug of a semiconductor device in accordance with the present invention.

As shown in FIG. 3A, a device isolation process for isolating devices is performed on a substrate 31, thereby forming a device isolation layer 32. Afterwards, a plurality of gate patterns formed by sequentially stacking a gate insulation layer 33, a gate electrode 34 and a gate hard mask nitride layer 35 are formed.

Subsequently, a spacer insulation layer is deposited on the substrate 31 including the plurality of gate patterns. Then, a blanket-etch is employed, thereby forming a plurality of gate spacers 36 in contact with both sidewalls of the gate patterns. At this time, the gate hard mask nitride layer 35 and the gate spacers 36 use a material having an etch selectivity with respect to a subsequent inter-layer insulation layer; however, in case of that the inter-layer insulation layer is a silicon oxide layer, a silicon nitride layer is used as the gate hard mask nitride layer 35 and the gate spacers 36.

Next, a typical ion-implantation process is employed in the substrate 31 exposed between the plurality of gate patterns, thereby forming a plurality of source/drain junctions 37 serving a role of a source/drain of a transistor. Herein, the source/drain junctions 37 can be lightly doped drain (LDD) structures. During forming the source/drain junctions 37, an N-type dopant such as arsenic (As) is implanted in a region where a N-channel metal-oxide semiconductor field-effect transistor (NMOSFET) is formed and a P-type dopant such as boron (B) is implanted in a region where a P-channel metal-oxide semiconductor field-effect transistor (PMOSFET) is formed.

Next, an inter-layer insulation layer 38 is formed on an entire surface of the substrate 31 and then, the inter-layer insulation layer 38 is planarized until an upper portion of the gate patterns are exposed.

Subsequently, a contact mask 39 is formed on the inter-layer insulation layer 38. Afterwards, a self aligned contact (SAC) process etching the inter-layer insulation layer 38 by using the contact mask 39 as an etch barrier is employed, thereby forming a plurality of contact holes 40 exposing the substrate 31 between the plurality of gate patterns.

Figure 3B:
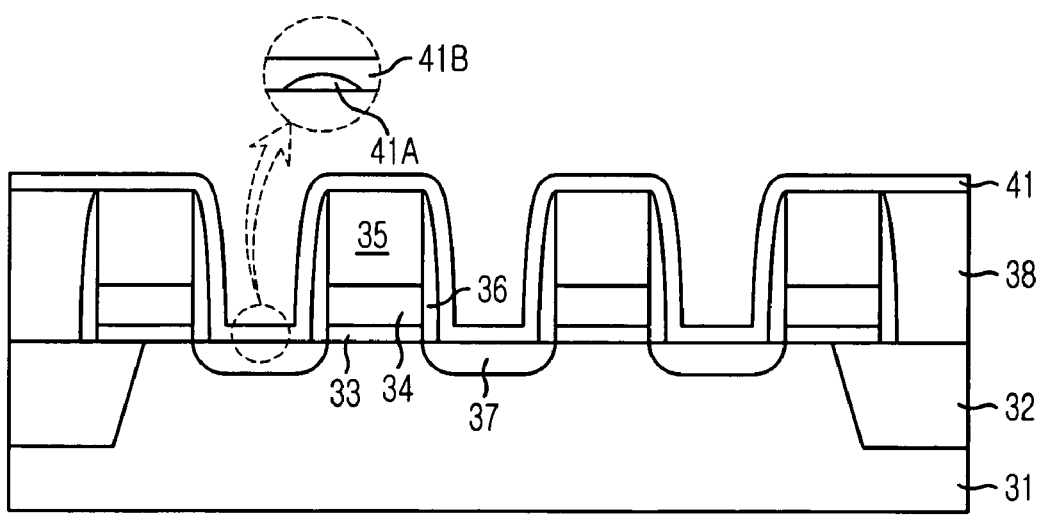

As shown in FIG. 3B, the contact mask 39 is removed, and then, the substrate 31 is loaded into a chamber to form a contact material.

Subsequently, before the contact material is formed, a pre-cleaning process is employed. That is, etch residues (not shown) remain in sidewalls and low portions of the contact holes 40 formed by etching the inter-layer insulation layer 38. Also, a silicon lattice defect caused by an etching process is generated on a surface of the source/drain junctions 37. Furthermore, a natural oxide layer is formed on the source/drain junctions 37 exposed as the contact holes 40 are formed thereon. The etch residues and the silicon lattice defect degrade a leakage current property of a device and the natural oxide layer increases a contact resistance, thereby deteriorating an electrical property of a device.

Accordingly, the pre-cleaning process performed before forming the contact material is performed after the contact holes 40 are formed. The pre-cleaning process can be employed through either a dry cleaning process or a wet cleaning process. The wet cleaning process applies a hydrogen fluoride (HF)-last cleaning process, i.e., a cleaning process using a HF solution at the last. The dry cleaning process applies a plasma cleaning process or a rapid thermal process. This pre-cleaning process is employed at a temperature ranging from approximately 0° C. to approximately 400° C.

The HF-last cleaning process is a cleaning process applying a HF-based cleaning at the last. For instance, The HF-last cleaning uses a chemical solution selected from a group consisting of $RNO[R(H_2SO_4+H_2O_2)+N(NH_4OH+H_2O_2)+O$ (HF-based BOE)], $RNF[R(H_2SO_4+H_2O_2)+N(NH_4OH+H_2O_2)+HF]$, RO, NO and RF. Herein, R is referred as SPM indicating a mixture of sulfuric ($H_2SO_4$) and peroxide ($H_2O_2$).

A gas used during performing the plasma cleaning process is selected from a group consisting of an hydrogen ($H_2$) gas, a mixed gas of $H_2$ and nitrogen ($N_2$), a chlorine fluoride (CF) based gas, a nitrogen fluoride (NF) based gas and a nitrogen hydride (NH) based gas. For instance, $H_2$, $H_2/N_2$, nitrogen trifluoride ($NF_3$), ammonia ($NH_3$) and tetrafluoromethane ($CF_4$) are used.

Meanwhile, during performing the pre-cleaning process, the drying cleaning process can use a rapid thermal cleaning process using a $H_2$-based gas. If a thermal process is proceeded in an $H_2$ gas atmosphere or an $H_2$-based gas atmosphere at a high temperature ranging from approximately 700° C. to approximately 900° C., there is an effect of simultaneously removing the etch residues and the natural oxide layer.

A series of the cleaning processes described above is continuously employed without any time delays after forming the contact holes 40 to maintain a clean state in an area contact holes 40 are exposed.

Through the pre-cleaning process described above, a defect on a bottom of the contact holes 40 is recovered and an interface material of the natural oxide layer is removed. Afterwards, a sacrificial silicon layer 41 on which an impurity with a high concentration ranging from approximately $1\times10^{20}$ atoms/cm$^3$ to approximately $1\times10^{21}$ atoms/cm$^3$ such as P or As is in-selectively doped through an in-situ process is thinly formed in a thickness ranging from approximately 50 Å to approximately 80 Å at a low temperature ranging from approximately 500° C. to approximately 600° C. enough to directly form an amorphous silicon form without an in-situ high temperature bake treatment process within a chamber. At this time, to form the sacrificial silicon layer 41, a silane ($SiH_4$) gas is used as a source gas. During depositing the sacrificial silicon layer 41, a phosphine ($PH_3$) gas is used to dope P on the sacrificial layer 41 through the in-situ process and an arsine ($AsH_3$) gas is used to dope As on the sacrificial layer 41.

During forming the sacrificial silicon layer 41 at the above described low temperature, a plurality of epitaxial silicon layers 41A are formed on the bottom portions of the contact holes 40, i.e., in interface regions between the substrate 31 and subsequent contact plugs. In the remaining regions, i.e., regions where the gate spacers 36 are formed and upper portions of the gate patterns, a plurality of amorphous silicon layers 41B are formed.

Figure 3C:
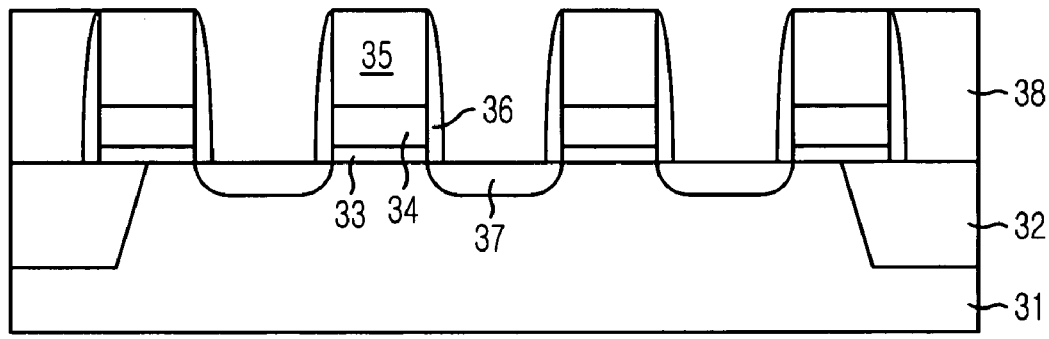

Next, as shown in FIG. 3C, an etching process selectively etching the sacrificial silicon layer 41 is employed. At this time, the etching process etching the sacrificial silicon layer 41 is performed in the chamber used during depositing the sacrificial silicon layer 41 through the in-situ process by using a halogen gas such as hydrogen chloride (HCl).

As explained in FIGS. 3B and 3C, if the sacrificial silicon layer 41 is deposited at the low temperature which the amorphous silicon can be formed, even though the in-situ high temperature bake treatment process, e.g., an hydrogen bake process, is not performed, an epitaxial growth is happened on the surfaces which the substrate 31 made of silicon is exposed, and thus, the epitaxial silicon layers 41A are formed. In other remaining regions, the amorphous silicon layers 41B are deposited. At this time, if P that is the doped impurity, is doped in a high concentration equal to or more than at least approximately $1 \times 10^{20}$ atoms/cm$^3$, i.e., a concentration ranging from approximately $1 \times 10^{20}$ atoms/cm$^3$ to approximately $1 \times 10^{21}$ atoms/cm$^3$, an oxygen atom partially existed in an interface between the sacrificial silicon layer 41 and the substrate 31 remains in a state of dissolution. If the sacrificial silicon layer 41 is continuously etched in the identical chamber at a temperature ranging from approximately 500° C. to approximately 700° C. through the in-situ process by flowing the HCl gas, a fine oxide layer existing in the interface between the substrate 31 and the contact plug can be removed without the high temperature hydrogen bake treatment process.

Compared with the conventional contact plug structure, the fine oxide layer remaining in the interface between the substrate 31 and the contact plugs can be removed through forming the sacrificial silicon layer 41 in accordance with the present invention. However, in accordance with the conventional contact plug structure, the plasma treatment process or the in-situ hydrogen bake treatment process is performed to remove the fine oxide layer that may be remain after the pre-cleaning process performed to the contact holes and accordingly, the surface defect due to the plasma and the thermal budget caused by performing the in-situ hydrogen bake process are generated.

As a result, in accordance with the present invention, through performing the steps of forming the sacrificial silicon layer 41 at the low temperature and removing the sacrificial layer 41, the fine oxide layer that may still remain after the pre-cleaning process can be removed. Thus, it is not necessary to perform the plasma treatment process or the in-situ high temperature hydrogen bake treatment process, thereby minimizing the surface defect due to the plasma and the thermal budget caused by the high temperature hydrogen bake process.

Figure 3D:
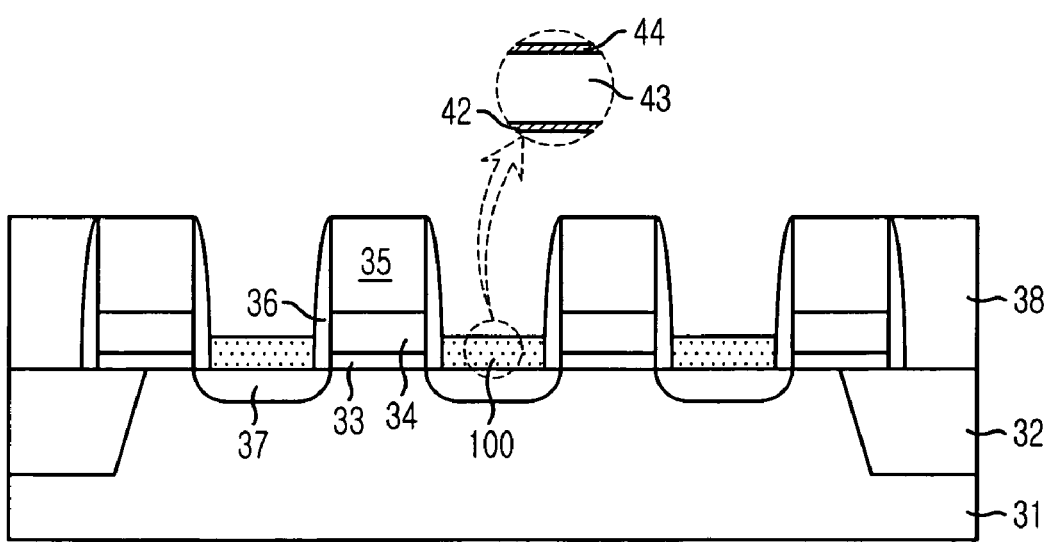

As shown in FIG. 3D, a plurality of epitaxial stacks 100 are formed in predetermined regions of the contact holes 40 completed with the process for forming and etching the sacrificial silicon layer 41 by using a SEG process.

Herein, the process for forming the epitaxial stacks 100 through the SEG process is a process for continuously growing the first SEG-silicon layer 41, the SEG-silicon germanium layer 43 and the second SEG-silicon layer 43.

First, the first SEG-silicon layer 42 serves roles in not only solving lattice disconformity between the SEG-silicon germanium layer 43 and the substrate 31, more preferably between the SEG-silicon germanium layer 43 and the source/drain junction 37 but also controlling a breakdown voltage by changing a general doping concentration of the epitaxial stack 100 used as the contact plug. The first SEG-silicon layer 42 is thinly deposited in a thickness ranging from approximately 10 Å to approximately 50 Å.

Secondly, the SEG-silicon germanium layer 43 uses an epitaxial silicon germanium thin layer and a deposition property to solve a low doping concentration and a low deposition speed which are problems a SEG-silicon layer provides. The first SEG-silicon layer 42 is continuously grown in a predetermined thickness. At this time, the first SEG-silicon layer 42 is grown by adding germanium (Ge) with a content ratio ranging from approximately 5% to approximately 30% through implanting a Ge source gas.

If the SEG-silicon germanium layer 43 is grown by adding the Ge gas during growing the SEG-silicon layer, it is possible to increase the doping concentration of P by using the same amount of a dopant gas at the same temperature.

As described above, since the deposition speed and the doping concentration of the SEG-silicon germanium layer 43 can be increased at the identical temperature than those of SEG-silicon layer, the SEG-silicon germanium layer 43 is grown more thickly in a thickness ranging from approximately 100 Å to approximately 300 Å than the SEG-silicon layer. In addition, the doping concentration of P of the SEG-silicon germanium layer 43 ranges from approximately $8 \times 10^{19}$ atoms/cm$^3$ to approximately $1 \times 10^{20}$ atoms/cm$^3$ and thus, the doping concentration of P of the SEG-silicon germanium layer 43 is relatively bigger than that of the SEG-silicon.

During growing the SEG-silicon germanium layer 43, SiH$_4$ is used with a flowing amount ranging from approximately 40 sccm to approximately 200 sccm and GeH$_4$ is used with a flowing amount ranging from approximately 2 sccm to approximately 60 sccm. Thus, Ge with a content ratio ranging from approximately 5% to approximately 30% is added to the SEG-silicon germanium layer 43.

Lastly, the second SEG-silicon layer 44 has a doping concentration of P ranging from approximately $1 \times 10^{19}$ atoms/cm$^3$ to approximately $5 \times 10^{19}$ atoms/cm$^3$ and is thinly grown in a thickness of approximately several tens Å, i.e., a thickness ranging from approximately 10 Å to approximately 50 Å, thereby being used as the pad layer during forming a subsequent metal layer. Thus, the second SEG-silicon layer 44 makes it to apply the metal layer.

The above described processes for forming the sacrificial layer 41, removing the sacrificial layer 41 and growing the epitaxial stacks 100 are performed by using an apparatus selected from a group consisting of a low pressure chemical vapor deposition (LPCVD) apparatus, a very low pressure chemical vapor deposition (VLPCVD) apparatus, a plasma enhanced chemical vapor deposition (PECVD) apparatus, an ultra high vacuum chemical vapor deposition (UHVCVD) apparatus, a rapid thermal chemical vapor deposition (RTCVD) apparatus and an atmospheric pressure chemical vapor deposition (APCVD) apparatus. Also, the aforementioned processes are performed at a temperature no more than approximately 700° C., i.e., a temperature ranging from approximately 400° C. to approximately 700° C., to minimize the thermal budget.

Figure 3E:
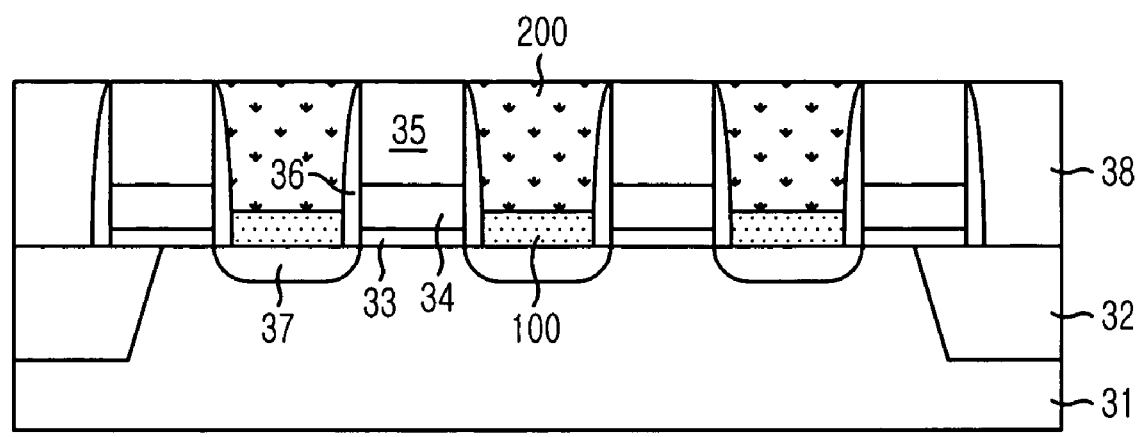

As shown in FIG. 3E, metal layers 200 are deposited on an entire surface of the epitaxial stacks 100 until the contact holes 40 are completely filled. At this time, before depositing the metal layers 200, the surface of the epitaxial stacks 100 are subjected to a pre-cleaning process such as a dry cleaning process or a wet cleaning process employed after forming the contact holes 40, thereby removing the natural oxide layer that may be remain on the surface of the epitaxial stacks 100.

Herein, the metal layers 200 are formed through a CVD process or a physical vapor deposition (PVD) process. For instance, the metal layers 200 are formed with a metal material with a low resistance selected from a group consisting of Ti, TiN, Ni, W and Co.

Next, until a surface of the gate hard mask nitride layer 35 is exposed, the metal layers 200 are subjected to a chemical mechanical polishing (CMP) process, thereby remaining the metal layers 200 on the epitaxial stacks 100 in a form that the metal layers 200 fill the contact holes 40.

Figure 4:
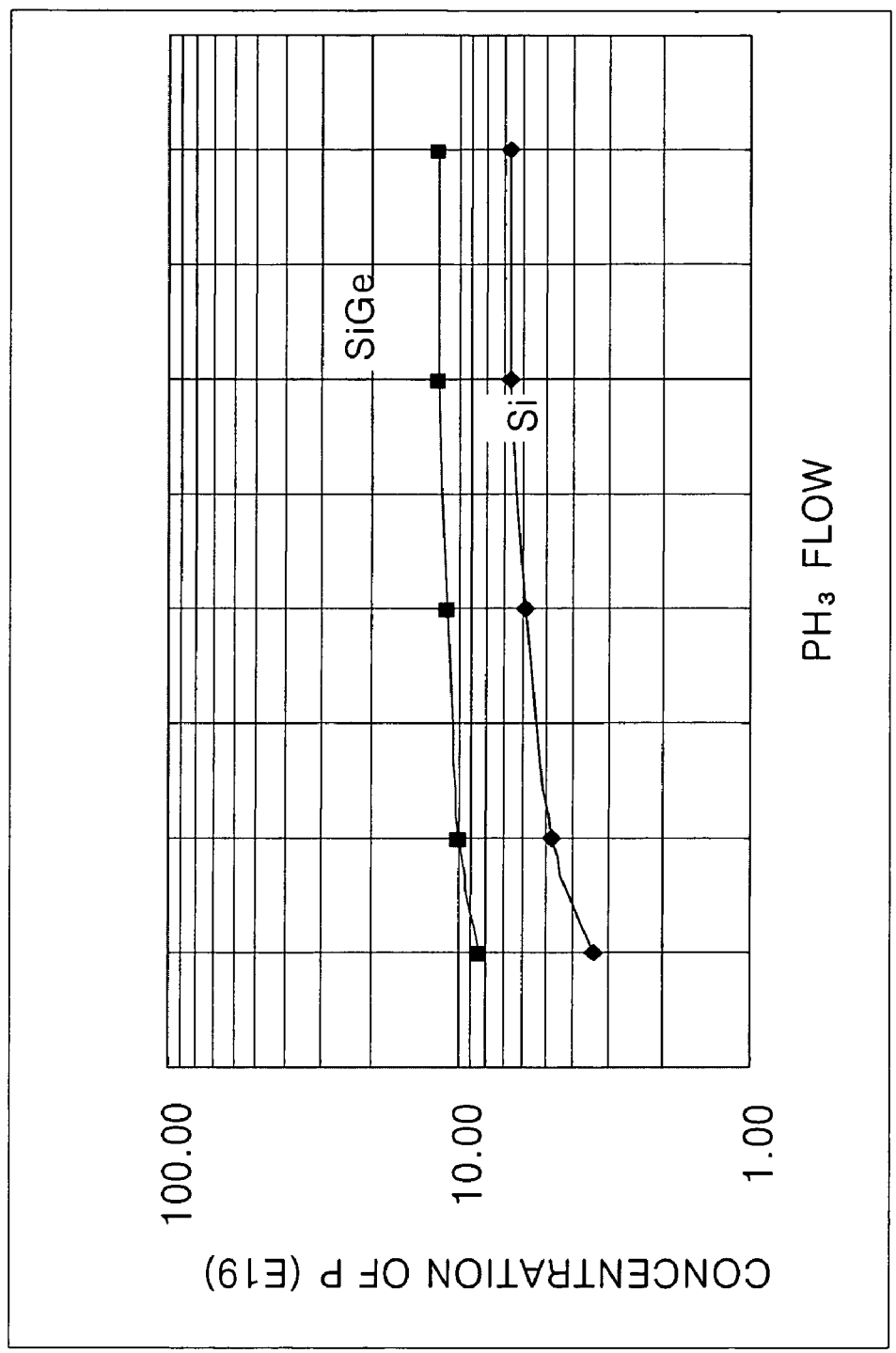
FIG. 4 is a graph illustrating a concentration of phosphorous (P) according to an amount of a phosphine ($PH_3$) gas in accordance with the present invention.

FIG. 4 is a graph illustrating a concentration of phosphorous (P) according to an amount of a phosphine (PH$_3$) gas in accordance with the present invention. In case of a SEG-silicon layer being comprised of two SEG-silicon layers herein, it is possible to obtain a concentration of P ranging from approximately $1\times10^{19}$ atoms/cm$^3$ to approximately $5\times10^{19}$ atoms/cm$^3$. Meanwhile, in case of SEG-silicon germanium, it is possible to dope. P at a concentration ranging from approximately $8\times10^{19}$ atoms/cm$^3$ to approximately $1\times10^{20}$ atoms/cm$^3$. Thus, it can be expected to reduce a resistance of a contact plug.

Furthermore, germane (GeH$_4$) used as a germanium source gas has a lower dissolution temperature than that of SiH$_4$ used as a silicon source gas. Also, GeH$_4$ promotes a reaction, thereby making it possible to perform a process at a low temperature. A deposition speed is also increased according to an increased amount of the GeH$_4$ gas as shown in FIG. 5.

Figure 5:
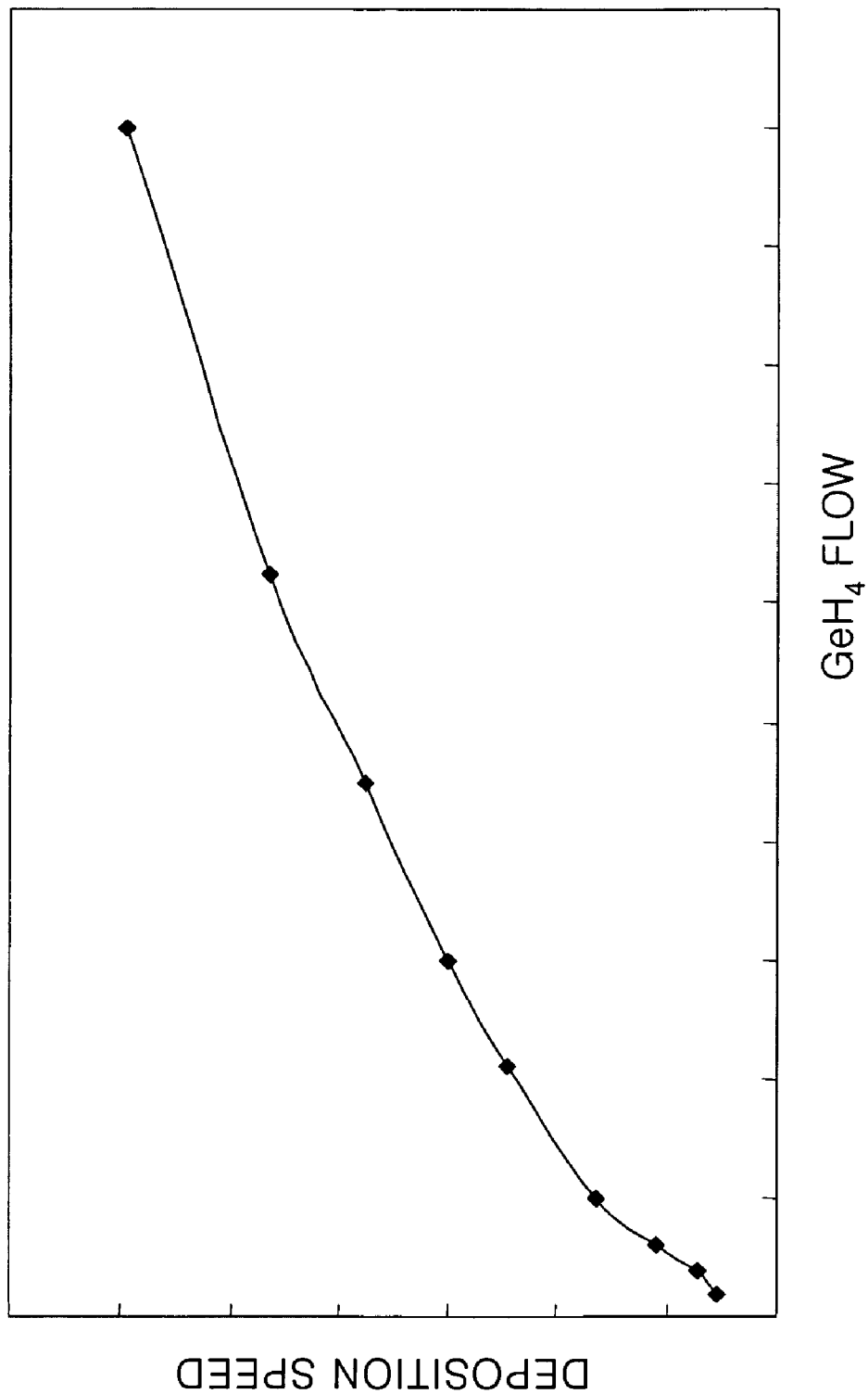
FIG. 5 is a graph illustrating a change in a deposition speed according to an amount of a germane ($GeH_4$) gas in accordance with the present invention.

FIG. 5 is a graph illustrating a change in a deposition speed according to an amount of a GeH$_4$ gas in accordance with the present invention. Referring to FIG. 5, as the amount of the GeH$_4$ gas is increased, the deposition speed is also increased.

As a result, the contact plug in accordance with the present invention is formed in a stack structure of the epitaxial stack 100 and the metal layer 200. The epitaxial stack 100 is formed by sequentially stacking the first SEG-silicon layer 42, the SEG-silicon germanium layer 43 and the second SEG-silicon layer 44. That is, the epitaxial stack 100 has a structure that a heteroepitaxy layer which is the SEG-silicon germanium layer 43 is inserted between a pair of homoepitaxy layers which are the first SEG-silicon layer 42 and the second SEG-silicon layer 44.

Accordingly, in accordance with the present invention, the contact plug selectively doped in a high concentration is formed due to a growth of the highly concentrated SEG-silicon germanium layer 43 and it is possible to minimize the thermal budget generated according to a high temperature required to the growth or an additional annealing process.

In accordance with the present invention, a contact plug formed in a dual layer with use of an epitaxial stack and a metal layer is formed. Also, the epitaxial stack including a SEG-silicon germanium layer that can be doped in a high concentration is formed. Thus, the contact plug selectively doped in the high concentration can provide an effect of minimizing a contact resistance.

Furthermore, a SEG-silicon germanium layer capable of obtaining a high doping concentration and a high deposition speed is used, thereby minimizing a thermal budget and reducing degradation in a device property without decreasing productivity.

The present application contains subject matter related to the Korean patent application No. KR 2005-0033263, filed in the Korean Patent Office on Apr. 21, 2005, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device comprising the steps of:
    forming a plurality of gate patterns directly on a substrate;
    filling the space between the gate patterns by forming an inter-layer insulation layer on the substrate;
    forming a contact hole, which exposes a predetermined surface of the substrate between the gate patterns, by selectively etching the inter-layer insulation layer;
    performing a first pre-cleaning process to recover a defect on a bottom portion of the contact hole and remove a first natural oxide layer;
    forming a sacrificial layer at a temperature, where an amorphous structure is formed, to remove a fine oxide layer remaining on a surface of the substrate of the bottom portion of the contact hole after performing the first pre-cleaning process;
    removing the sacrificial layer;
    forming an epitaxial stack including at least a SEG-silicon germanium layer through the SEG process on the contact hole;
    performing a second pre-cleaning process to remove a second natural oxide layer on a surface of the epitaxial stack; and
    forming a metal layer filling the contact hole on the epitaxial stack,
    wherein a surface of the metal layer is formed on a same plane as a surface of the gate patterns.

2. The method of claim 1, wherein the step of forming the epitaxial stack includes the steps of:
    growing a first SEG-silicon layer;
    growing a SEG-silicon germanium layer on the first SEG-silicon layer; and
    growing a second SEG-silicon layer on the SEG-silicon germanium layer.

3. The method of claim 2, wherein the step of growing the SEG-silicon germanium layer includes the steps of:
    growing the first SEG-silicon layer to a predetermined thickness; and
    additionally flowing a germane (GeH$_4$) gas, thereby adding a germanium (Ge) gas with a content ratio ranging from approximately 5% to approximately 30% to the SEG-silicon germanium layer.

4. The method of claim 2, wherein during growing the first SEG-silicon layer, the SEG-silicon germanium layer and the second SEG-silicon layer, P is doped through an in-situ process.

5. The method of claim 4, wherein a doping concentration of P ranges from approximately $1\times10^{19}$ atoms/cm$^3$ to approximately $5\times10^{19}$ atoms/cm$^3$ for the first and the second SEG-silicon layers and a doping concentration of P ranges from approximately $8\times10^{19}$ atoms/cm$^3$ to approximately $1\times10^{20}$ atoms/cm$^3$ for the SEG-silicon germanium layer.

6. The method of claim 2, wherein the first and the second SEG-silicon layers are grown to a thickness ranging from approximately 10 Å to approximately 50 Å and the SEG-silicon germanium layer is grown in a thickness ranging from approximately 100 Å to approximately 300 Å.

7. The method of claim 1, wherein the steps of forming the sacrificial layer, removing the sacrificial layer and growing the epitaxial stack are performed by using an apparatus selected from a group consisting of a low pressure chemical vapor deposition (LPCVD) apparatus, a very low pressure chemical vapor deposition (VLPCVD) apparatus, a plasma enhanced chemical vapor deposition (PECVD) apparatus, an ultra high vacuum chemical vapor deposition (UHVCVD) apparatus, a rapid thermal chemical vapor deposition (RTCVD) apparatus and an atmospheric pressure chemical vapor deposition (APCVD) apparatus at a temperature ranging from approximately 400° C. to approximately 700° C.

8. The method of claim 1, wherein for the step of forming the sacrificial layer, silicon, selectively doped with impurities ranging from approximately $1\times10^{20}$ atoms/cm$^3$ to approximately $1\times10^{21}$ atoms/cm$^3$ at a temperature ranging from approximately 500° C. to approximately 600° C., is deposited in a thickness ranging from approximately so 50 Å to approximately 80 Å.

9. The method of claim 1, wherein the step of removing the sacrificial layer is performed in a chamber where the sacrificial layer is formed by using a halogen gas through an in-situ process.

10. The method of claim 1, wherein the metal layer is selected from a group consisting of titanium (Ti), titanium nitride (TiN), nickel (Ni), tungsten (W) and cobalt (Co).

11. The method of claim 1, wherein the first and the second pre-cleaning processes are employed through one of a dry cleaning process and a wet cleaning process.

12. The method of claim 11, wherein the dry cleaning process is performed through a rapid thermal process in one of a hydrogen gas atmosphere and a hydrogen based gas atmosphere at a high temperature ranging from approximately 700° C. to approximately 900° C.

* * * * *